(12) United States Patent
You

(10) Patent No.: US 8,356,152 B2
(45) Date of Patent: Jan. 15, 2013

(54) INITIATIVE WEAR LEVELING FOR NON-VOLATILE MEMORY

(75) Inventor: Guangqing You, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 580 days.

(21) Appl. No.: 12/519,521

(22) PCT Filed: Dec. 27, 2006

(86) PCT No.: PCT/CN2006/003615
§ 371 (c)(1),
(2), (4) Date: Feb. 11, 2010

(87) PCT Pub. No.: WO2008/077284
PCT Pub. Date: Jul. 3, 2008

(65) Prior Publication Data
US 2010/0161880 A1    Jun. 24, 2010

(51) Int. Cl.
*G06F 12/00* (2006.01)
(52) U.S. Cl. .................. 711/165; 711/103; 711/173
(58) Field of Classification Search .................. 711/103, 711/165, 173
See application file for complete search history.

(56) References Cited

U.S. PATENT DOCUMENTS

| | | | |
|---|---|---|---|
| 5,341,339 A | 8/1994 | Wells | |
| 5,479,638 A | 12/1995 | Assar et al. | |
| 5,485,595 A | 1/1996 | Assar et al. | |
| 5,568,423 A | 10/1996 | Jou et al. | |
| 5,835,935 A | 11/1998 | Estakhri et al. | |
| 5,963,970 A | 10/1999 | Davis | |
| 6,000,006 A | 12/1999 | Bruce et al. | |
| 6,016,275 A | 1/2000 | Han | |
| 6,081,447 A | 6/2000 | Lofgren et al. | |
| 6,230,233 B1 | 5/2001 | Lofgreen et al. | |
| 6,341,085 B1 | 1/2002 | Yamagami et al. | |
| 6,594,183 B1 | 7/2003 | Lofgren et al. | |
| 6,732,221 B2 | 5/2004 | Ban | |
| 6,850,443 B2 | 2/2005 | Lofgren et al. | |
| 6,865,122 B2 | 3/2005 | Srinivasan | |

(Continued)

FOREIGN PATENT DOCUMENTS

JP     8-16482     1/1996

(Continued)

OTHER PUBLICATIONS

Non-Final Office Action for Korean Patent Application No. 10-2009-7013437, mailed Dec. 3, 2010.

(Continued)

*Primary Examiner* — Jared Rutz
*Assistant Examiner* — Gurtej Bansal
(74) *Attorney, Agent, or Firm* — Blakely, Sokoloff, Taylor & Zafman LLP

(57) ABSTRACT

A method and apparatus for initiative wear leveling for non-volatile memory. An embodiment of a method includes counting erase cycles for each of a set of multiple memory blocks of a non-volatile memory, the counting of erase cycles for each memory block including incrementing a first count for a physical block address of the memory block, and if the memory block is not a spare memory block, incrementing a second count for a logical block address of the memory block. The method also includes determining whether the non-volatile memory has uneven wear of memory blocks based at least in part on the counting of the erase cycles of the plurality of memory blocks.

16 Claims, 9 Drawing Sheets

U.S. PATENT DOCUMENTS

| | | | |
|---|---|---|---|
| 6,937,948 | B2 | 8/2005 | Rajguru |
| 6,973,531 | B1 | 12/2005 | Chang et al. |
| 6,985,992 | B1 | 1/2006 | Chang et al. |
| 7,032,087 | B1 | 4/2006 | Chang et al. |
| 7,035,967 | B2 | 4/2006 | Chang et al. |
| 7,057,934 | B2 | 6/2006 | Krishnamachari et al. |
| 7,106,636 | B2 | 9/2006 | Eilert et al. |
| 7,120,729 | B2 | 10/2006 | Gonzalez et al. |
| 2002/0184432 | A1 | 12/2002 | Ban |
| 2003/0227804 | A1 | 12/2003 | Lofgren et al. |
| 2004/0083335 | A1* | 4/2004 | Gonzalez et al. ............. 711/103 |
| 2004/0210706 | A1 | 10/2004 | In et al. |
| 2005/0055495 | A1 | 3/2005 | Vihmalo et al. |
| 2005/0114589 | A1 | 5/2005 | Lofgren et al. |
| 2006/0069850 | A1 | 3/2006 | Rudelic |
| 2006/0106755 | A1* | 5/2006 | Stuhec .............................. 707/1 |
| 2006/0106972 | A1 | 5/2006 | Gorobets et al. |

FOREIGN PATENT DOCUMENTS

| | | | |
|---|---|---|---|
| WO | WO2004/040578 | A2 | 5/2004 |
| WO | WO2004/040585 | A1 | 5/2004 |

OTHER PUBLICATIONS

International Preliminary Report on Patentability for International Patent Application No. PCT/CN2006/003615, Mailed Jun. 30, 2009, 4 pages.

"Advantages of Large Erase Blocks", Intel Corporation, Dec. 1998, 7 pages.

"Electronic Tools Catalog", http://appzone.intel.com/toolcatalog/listtools.asp?pid=4756&cid=588&pfamily=, Nov. 13, 2006, 2 pages.

"Increasing Flash Solid State Disk Reliability", http://www.storagesearch.com/siliconsys-art1.html, May 18, 2006, 12 pages.

"Intel Flash Memory Software Builder", http://www.intel.com/design/flash/swb/psm.htm, Nov. 13, 2006, 4 pages.

"Intel Flash Memory Software: Your Advantage for Cellular Handsets", Intel Corporation, 2006, 2 pages.

"Intel NOR Flash Memory: Smart Choice for Cellular Handsets", Intel Corporation, 2006, 2 pages.

"NAND128-A, NAND256-A, NAND512-A, NAND01G-A", 128 Mbig, 256 Mbit, 512 Mbit, 1 Gbit (x8/x16), 528 Byte/264 Word Page, 1.8V/3V, NAND Flash Memories, Apr. 2004, 56 pages.

"SanDisk Flash Memory Cards Wear Leveling", SanDisk Corporation, Oct. 2003, 6 pages.

"TrueFFS Wear-Leveling Mechanism", M-Systems Flash Disk Pioneers, Ltd., May 20, 2002, 4 pages.

"Wear Leveling in Single Level Cell NAND Flash Memories", STMicroelectronics, 2004, 6 pages.

"What is Flash Memory?", http://www.intel.com/design/flash/articles/what.htm, Nov. 13, 2006, 7 pages.

"Why Intel Flash Memory?", http://www.intel.com/design/flash/articles/297906.htm, Nov. 13, 2006, 2 pages.

International Search Report and Written Opinion as issued in related International Patent Application No. PCT/CN2006/003615, on Sep. 27, 2007, 9 pages.

Office Action from JP Application No. 2009-543319 mailed Dec. 26, 2011, 2 pages.

* cited by examiner

| 425 → | 430 → | 435 → | 440 → | 445 → | 450 → | 455 → | 460 → |
|---|---|---|---|---|---|---|---|
| PB0 | PB1 | PB2 | PB3 | PB4 | PB5 | PB6 | PB7 |
| LB6 | LB5 | LB4 | LB3 | LB2 | LB1 | LB0 | SPARE |
| LBEC=7 | LBEC=3 | LBEC=40 | LBEC=33 | LBEC=21 | LBEC=1 | LBEC=30 | |
| PBEC=4 | PBEC=6 | PBEC=11 | PBEC=14 | PBEC=17 | PBEC=25 | PBEC=28 | PBEC=30 |

| 525 → | 430 → | 435 → | 440 → | 445 → | 450 → | 455 → | 560 → |
|---|---|---|---|---|---|---|---|
| PB0 | PB1 | PB2 | PB3 | PB4 | PB5 | PB6 | PB7 |
| SPARE | LB5 | LB4 | LB3 | LB2 | LB1 | LB0 | LB6 |
|  |  |  |  |  |  |  |  |
|  | LBEC=3 | LBEC=40 | LBEC=33 | LBEC=21 | LBEC=1 | LBEC=30 | LBEC=8 |
| PBEC=5 | PBEC=6 | PBEC=11 | PBEC=14 | PBEC=17 | PBEC=25 | PBEC=28 | PBEC=30 |

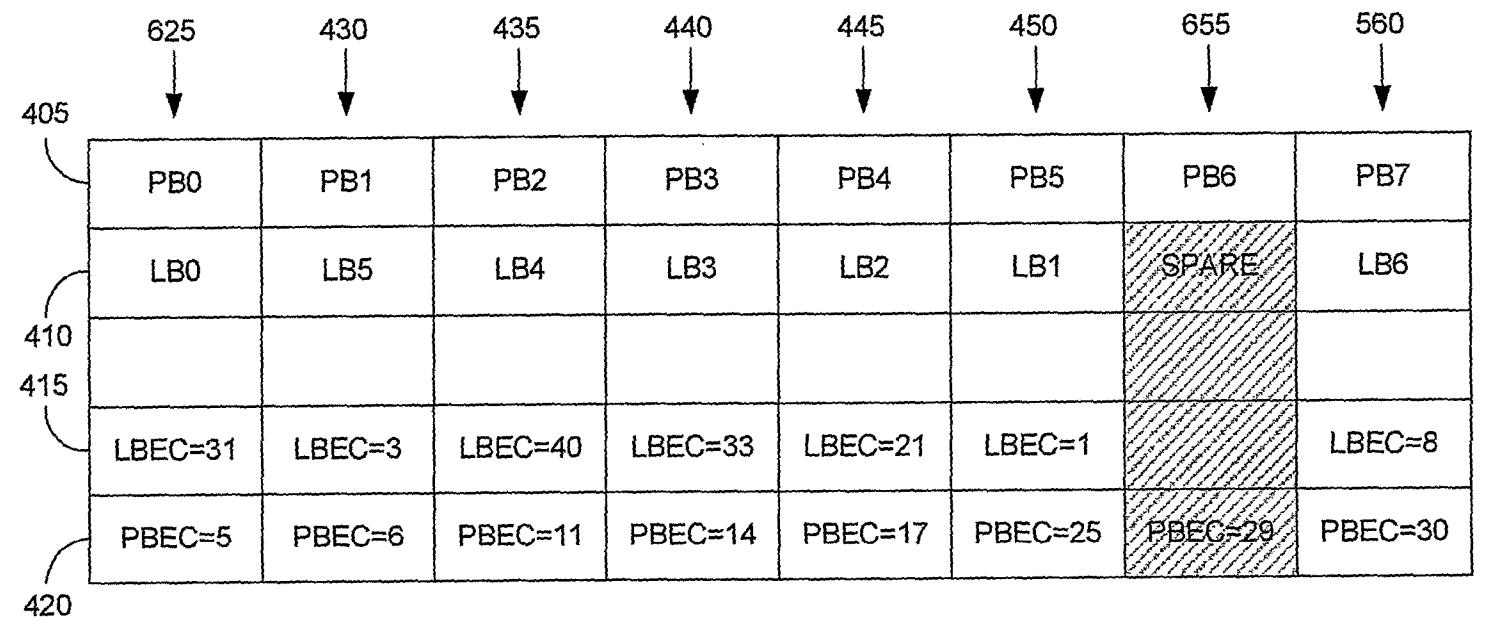

| | 625 → | 430 → | 435 → | 440 → | 445 → | 450 → | 655 → | 560 → |
|---|---|---|---|---|---|---|---|---|
| 405 | PB0 | PB1 | PB2 | PB3 | PB4 | PB5 | PB6 | PB7 |
| 410 | LB0 | LB5 | LB4 | LB3 | LB2 | LB1 | SPARE | LB6 |
| 415 | | | | | | | | |
| | LBEC=31 | LBEC=3 | LBEC=40 | LBEC=33 | LBEC=21 | LBEC=1 | | LBEC=8 |
| 420 | PBEC=5 | PBEC=6 | PBEC=11 | PBEC=14 | PBEC=17 | PBEC=25 | PBEC=29 | PBEC=30 |

Fig. 6

INITIATIVE WEAR LEVELING FOR NON-VOLATILE MEMORY

CROSS REFERENCE TO RELATED APPLICATION

This patent application is a U.S. National Phase application under 35 U.S.C. § 371 of International Application No. PCT/CN2006/003615, filed on Dec. 27, 2006, entitled INITIATIVE WEAR LEVELING FOR NON-VOLATILE MEMORY.

FIELD

Embodiments of the invention relate to computer memory. More particularly, embodiments of the invention relate to wear leveling for non-volatile memory.

BACKGROUND

In computer and electronic device operations, flash memory and similar non-volatile memory can provides great advantages in the maintenance of data, providing low power operation with low cost and high density. Because data is stored in a compact format that requires minimal power in operation and does not require power to maintain storage, such memory is being used in increasing numbers of applications.

However, non-volatile memory has certain downsides in operation. For example, memory such as flash memory has a limited lifespan in use because such memory tends to deteriorate with each write cycle. For this reason, if a certain portion of the memory is subject to more write operations than other portions of the memory, then the portions with a greater number of writes will tend to deteriorate and ultimately fail more quickly.

In order to lengthen the overall lifespan of flash memory, a wear leveling process may be implemented. The wear leveling process is intended to more evenly distribute the wear over the storage device by directing write operations to less heavily used portions of the memory. This process may be handled by the memory controller, with the host system being unaware of the process.

Wear leveling may include an algorithm for re-mapping logical block addresses to different physical block addresses in the device's solid-state memory array.

However, the algorithm used can greatly affect the efficiency of memory operation and the effectiveness of the wear leveling process. Issues such as the timing of re-mapping processes, the manner in which the appropriate physical areas are identified for re-mapping, and related issues can greatly affect memory operation.

BRIEF DESCRIPTION OF THE DRAWINGS

Embodiments of the invention are illustrated by way of example, and not by way of limitation, in the figures of the accompanying drawings in which like reference numerals refer to similar elements:

FIGS. 4 through 7 illustrate an example of memory block reclaim operations in an embodiment of a wear leveling process;

DETAILED DESCRIPTION

Figure 1:
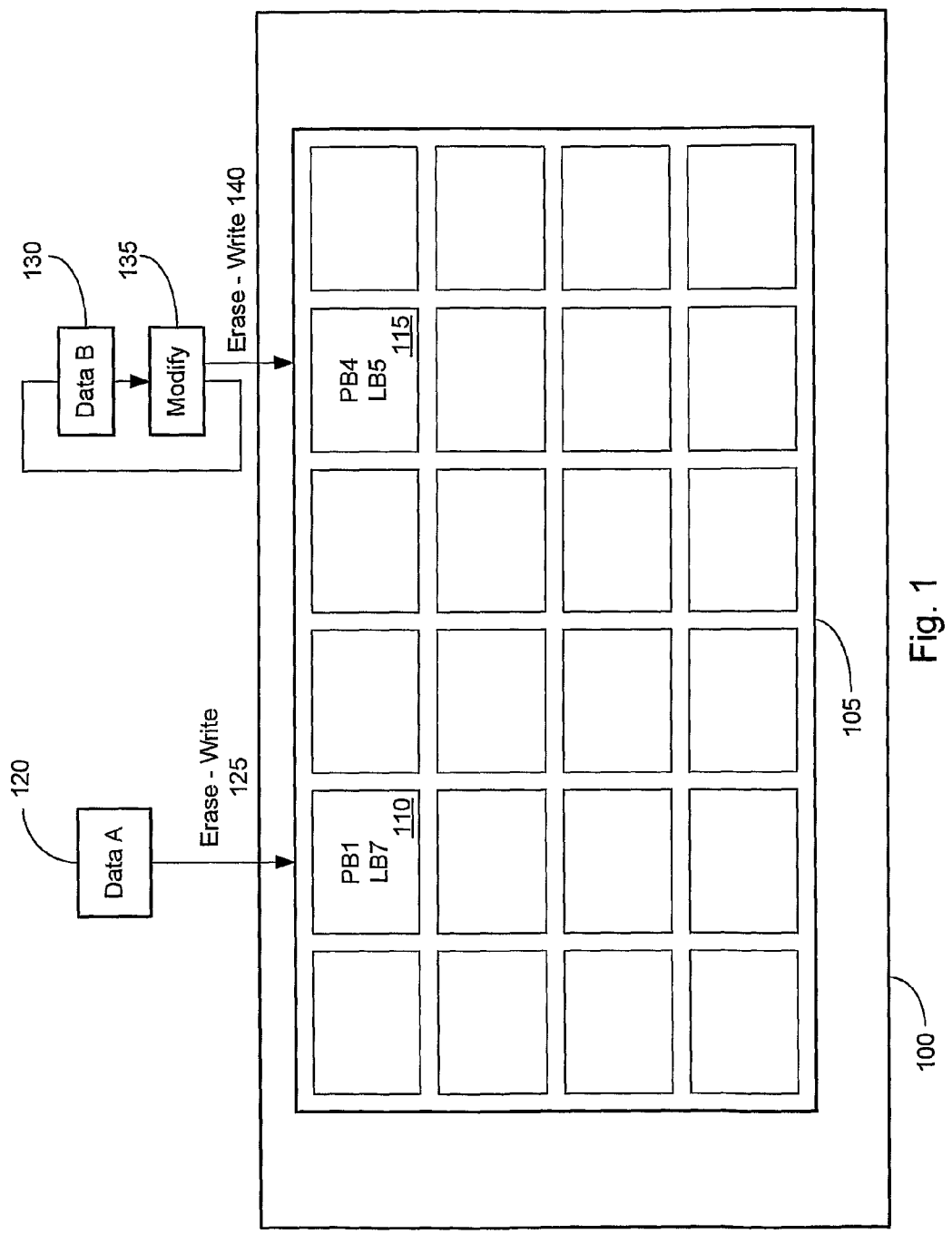
FIG. 1 is an illustration of an embodiment of a non-volatile memory.

An embodiment of the invention concerns initiative wear leveling for non-volatile memory.

As used herein:

"Non-volatile memory" means memory that retains memory contents when power is not applied to the memory. Non-volatile memory includes flash memory.

"Flash memory" means non-volatile computer memory that can be electrically erased and reprogrammed. Flash memory stores information in an array of floating gate transistors, called "cells", each of which stores one or more bits of information. As used herein, "flash memory" may include any of the technologies for flash memory storage. For example, flash memory may include both NOR and NAND technology memory. In addition, flash memory may include technologies that provide varying numbers of bits of information per memory cell, including single-bit-per-cell flash memory and multi-level cell structure allowing multiple bits per cell.

"Wear" means usage of a non-volatile memory.

"Block" means a portion of a non-volatile memory array that may be erased in an operation, the block containing multiple cells. Individual cells of an erased flash memory block may be programmed, but cells within a block of a flash memory may only be changed by erasing the entire block of memory.

In an embodiment of the invention, the uneven wear of flash or other non-volatile memory is addressed utilizing a wear leveling process. In an embodiment of the invention, wear leveling is implemented by exchanging data from a group of most worn memory blocks with data from a group of least worn memory blocks. In an embodiment, a wear leveling process for non-volatile memory includes the maintenance of counts for erase operations for memory blocks both for each physical block address and for each logical block address. In an embodiment, the wear leveling process is triggered at certain intervals when there is a determination that a slope of a line representing the physical block erase count and logical block erase count of each memory block is greater than a certain threshold.

Non-volatile memory such as flash memory has limitations in operation because the memory will only allow a certain finite number of erase-write cycles, and it is necessary to erase a block prior to writing any data into the cells of the block. For example, most commercially available flash products are guaranteed to withstand 1 million programming cycles. For this reason, care should to be taken when moving hard-drive based applications, such as operating systems, to flash-memory based devices such as CompactFlash. The effect of uneven wear may be partially offset by certain chip firmware or file system drivers by counting the writes and dynamically remapping the blocks in order to spread the write operations between the sectors, or by write verification and remapping to spare sectors in case of write failure. However, over time the variation in activity of data generally will result in uneven wear.

In the operation of nonvolatile memories, it is generally also recommended to implement a wear leveling process or algorithm to monitor and spread the number of write cycles that occur per block of memory. This is particularly important for write-intensive applications. If wear leveling is not implemented, then memory blocks may be utilized at very different rates. Blocks with long-lived data are not required to endure as many erase-write cycles as the blocks with frequently changing data. The wear leveling process is intended to ensure that generally equal use is made of all the available write cycles for each block. In general, wear leveling may include exchanging data between memory blocks.

In an embodiment of the invention, a wear leveling process (which may be referred to as IWL, or Initiative Wear Leveling) is implemented in non-volatile memory. In an embodiment of the invention, the wear leveling for non-volatile memory includes the exchange of groups of memory blocks, rather than individual memory blocks. In this embodiment, a first group may represent the most highly worn memory blocks of a non-volatile memory device and a second group may represent the least worn memory blocks. The data may be exchanged between blocks in such groups.

In an embodiment of the invention, a process for wear leveling of non-volatile memory includes the recording of the number of erase operations for memory blocks both for physical and logical addresses. In an embodiment, in addition to maintaining PBEC (Physical Block Erase Count) value to track how many reclaim operations have occurred on a physical block, a LBEC (Logical Block Erase Count) value is maintained that is indexed by a logical block index for each memory block to track the change frequency of data per logical block. In this manner, each time a memory block is reclaimed its PBEC and LBEC values will each be increased by 1.

In an embodiment, the following will be true regarding PBEC and LBEC values:
1. PBEC increment=LBEC increment (the reclaiming of a memory block with result in incrementing both PBEC and LBEC)
2. Sum of total PBEC for device≧sum of total LBEC for the device
3. Sum of total PBEC for device=sum of total LBEC for the device if file system is initiated on a fresh memory device.

If a file system is initialized and shut down and there has been no formatting of the memory, the LBEC and PBEC values are equal. If a memory device is formatted before a file system is initialized, then it may be assumed that the PBEC values are kept or restored after format is finished. However, LBEC values may be erased because the block data is erased. Since the block data in this case is used to reflect how active data is, there is no reason to save its LBEC after the data is deleted. As a result, for a fresh/new/total-erased memory device, the sum (LBEC)=sum(PBEC). Once a format of the device has occurred, the LBECs have been erased, and subsequently the sum(PBEC) will be greater than sum(LBEC).

In an embodiment of the invention, a PBEC field is utilized to track how many reclaim operations occurred on each physical block. In an embodiment, an additional LBEC field is indexed by logical block index to track the change frequency of data by logical block. Thus, each time a logical data block is reclaimed, its LBEC will be increased by one, as well as the PBEC for the relevant physical data block being increased by one. In an embodiment:

(1) PBEC increment=LBEC increment—each is incremented by one each time a block is reclaimed
(2) Sum of total PBEC≧sum of total LBEC
(3) Sum of total PBEC=sum of total LBEC if file system initialized on a fresh flash.

In an embodiment of the invention, at least two WBGs (Worn Block Groups) are designated in an IWL wear leveling process. A first group is referred to as the "high group". The high group will have relatively high PBEC and high LBEC values, and may include any spare blocks because reclaim cycles happen frequently for space blocks of non-volatile memories. A second group is referred to as the "low group" and will have relatively low PBEC and low LBEC, with spare blocks excluded. The IWL process is then intended to swap the high-LBEC logical blocks and low-LBEC logical blocks between the two groups, which may be accomplished through a series of reclaim operations. This procedure is referred to as the WBG swap. The purpose of the WBG swap is to populate long lived (low LBEC) data blocks to much worn (high PBEC) blocks and populate frequently changed (high LBEC) data blocks to less worn (low PBEC) blocks. In this operation, spare blocks have a high potential for being the next reclaim block and thus high-PBEC spare blocks are moved to the opposite group as well.

However, a wear leveling process may affect certain common memory operations, including the normal reclaim operations. Because of this, wear leveling may require balancing against memory performance. In an embodiment of the invention, certain values may be set to affect the frequency of wear of wear leveling. In embodiment, a user may sets the ECMOD (erase count interval) and the SLOPETH values (slope threshold). Increasing these values will reduce the performance cost, although at a potential cost of some life of the nonvolatile device.

In an embodiment of the invention, a non-volatile memory includes wear leveling that is based at least in part upon the number of erase operations for each physical block of memory and the number of erase operations for each logical block of memory. In an embodiment, wear leveling operations are initiated when the slope of a regression line exceeds a threshold, the regression line being generated for the physical erase count for each block versus logical erase count for each such block.

In an embodiment of the invention, the initiation of an IWL process may be triggered by the slope of a line that is fit to a graph of the physical block and logical block erase counts for each memory block, with the slope of the line also being used to determine if the operation has been successful. In an embodiment, a statistical method may be used to fit the line to the error count data. In a particular embodiment, linear regression is used to determine when an IWL operation is required and to measure how successful an executed IWL operation has been. Linear regression attempts to model the relationship between two variables by fitting a linear equation to observed data. The most common method for fitting a regression line is the least-squares method. The least squares line method applies an equation of the form $f(x)=a+bx$, which is a line graph having an intercept at a and having a slope of b. The method describes the trend of a raw data set $(l_1, p_1)$, $(l_2, p_2)$, ..., $(l_n, p_n)$ as follows:

$$a = \frac{\left(\sum_{i=1}^{n} p_i\right)\left(\sum_{i=1}^{n} l_i^2\right) - \left(\sum_{i=1}^{n} l_i\right)\left(\sum_{i=1}^{n} p_i l_i\right)}{n\left(\sum_{i=1}^{n} l_i^2\right) - \left(\sum_{i=1}^{n} l_i\right)^2}, \; b = \frac{n\left(\sum_{i=1}^{n} p_i l_i\right) - \left(\sum_{i=1}^{n} l_i\right)\left(\sum_{i=1}^{n} p_i\right)}{n\left(\sum_{i=1}^{n} l_i^2\right) - \left(\sum_{i=1}^{n} l_i\right)^2}$$

In the operation of a non-volatile memory device, there are three cases for regression line slope b:
- b=0, which may occur when a system is initialized on fresh flash or when wear leveling has been maintained
- b>0, which occurs when wear is unleveled; and
- b<0, which occurs in a successful process when WBGs have been swapped.

In an embodiment of the invention, wear leveling may be limited to occurring only after certain intervals. For example, ECMOD is the erase count interval that elapses prior to triggering an IWL process. For example, ECMOD could be 1000 cycles or less. Further, the triggering of the wear leveling is governed by SLOPETH, the PBEC-LBEC regression line slope threshold. In non-volatile memory, a normal reclaim operation may be used to reclaim a "dirty" memory block containing invalid data, with the operation intended to free up the invalided memory space. In an IWL implementation, the normal reclaim procedure for the non-volatile memory is not modified, but the wear leveling process may affect the performance of the background reclaim task. A user or designer may address the issues of memory life and customer performance needs by adjusting the ECMOD and SLOPETH parameters, which operate together to determine the frequency of wear leveling. For example, a customer may reduce the performance cost of wear leveling by increasing ECMOD and SLOPETH.

In an implementation of wear leveling, the processing may generally be handled by the solid-state memory controller, and thus be independent of the host system. In such an implementation, the host system performs its reads and writes to logical block addresses only, and does not utilize the underlying physical block addresses. In this manner, the host will be unaware of any movements of data that occur as a result of wear leveling. However, embodiments of the invention may vary with regard to memory control, and are not limited to any particular method of memory control.

If a file system is initialized and shut down and there is no format operation, the increment of LBEC and increment of PBEC are equal. However, before the file system is initialized, if a flash is formatted PBEC is kept or restored after format is finished, but LBEC would be expected to be erased all because the block data is erased, and thus there no need to save its LBEC. As a result, for a fresh, new, or total-erased flash, its sum(LBEC)=sum(PBEC). Once a format happens, the LBECs are erased so the sum(PBEC) may be greater than sum(LBEC).

In the examples provided, a single threshold value is utilized for the determination of when to begin and when to end a wear leveling process. However, embodiments of the invention may utilize more than one threshold. In an embodiment of the invention, a process may utilize two thresholds to reduce the number of times that the exchange process is needed. In this example, a non-volatile memory is subject to normal use, which results in the gradual increase of a regression line fit to the values of the physical block erase count values and logical block erase count values of the memory blocks. A worn block exchange process may be initiated when the slope of a regression line for the memory blocks is above a first threshold. Once initiated, the worn block group exchanges may continue until the slope of the regression line is less than a second threshold, at which time the exchange process would cease. The process would then return to the original state, in which the worn block exchange process would be initiated when the slope of the regression line again exceeds the first threshold. In returning to normal operation, the slope of the regression line would again gradually increase as more erase cycles occur at certain highly active memory blocks.

FIG. 1 is an illustration of an embodiment of a non-volatile memory.

In this illustration, a non-volatile memory device 100 includes an array of memory blocks 105. In one example, the array of memory blocks may 105 include a first memory block 110 having a physical block address PB1 and a logical block address LB7, and a second memory block 115 having a physical block address PB4 and a logical block address LB5. The addresses provided are simply an example, and any physical or logical address may be present. In each operation, each block of the memory array 105 may be subject to multiple erase and write cycles, with each cycle resulting in shortening the lifespan of the cells affected.

As illustrated, the first memory block 110 may be relatively inactive, with the block being erased and a set of data A 120 being written 125 to the block 110. In contrast, the second memory block 115 is relatively active, with, for example, data B 130 being modified 135, resulting in multiple erase and write operations 140 to the cells of the second block 115, as each write process requiring an erasure of the data in the block. As a result, over time the wear on the second memory block 115 may be considerably greater than the wear on the first memory block 110.

In an embodiment of the invention, the array of memory blocks is subjected to wear leveling to even the wear on the memory blocks. In this embodiment, the wear leveling is based upon a count for physical block write cycles and a count for logical block write cycles. In an embodiment, a wear leveling algorithm is initiated when the slope of a line fit to the physical block write cycles and the logical block write cycles by linear regression reaches a threshold. In an embodiment, the algorithm provides a data reclamation in which the data contained in a most worn block group (which may include the second memory block 115) is exchanged for the data contained in a least worn block group (which may include the first memory block 110). In another example, the least worn group may include a spare memory block, spare blocks being very likely to be reclaimed. After the exchange between the designated groups, the remaining blocks may be subject to further exchanges, with the process continuing until the slope of the regression line is no longer above the threshold.

Figure 2:
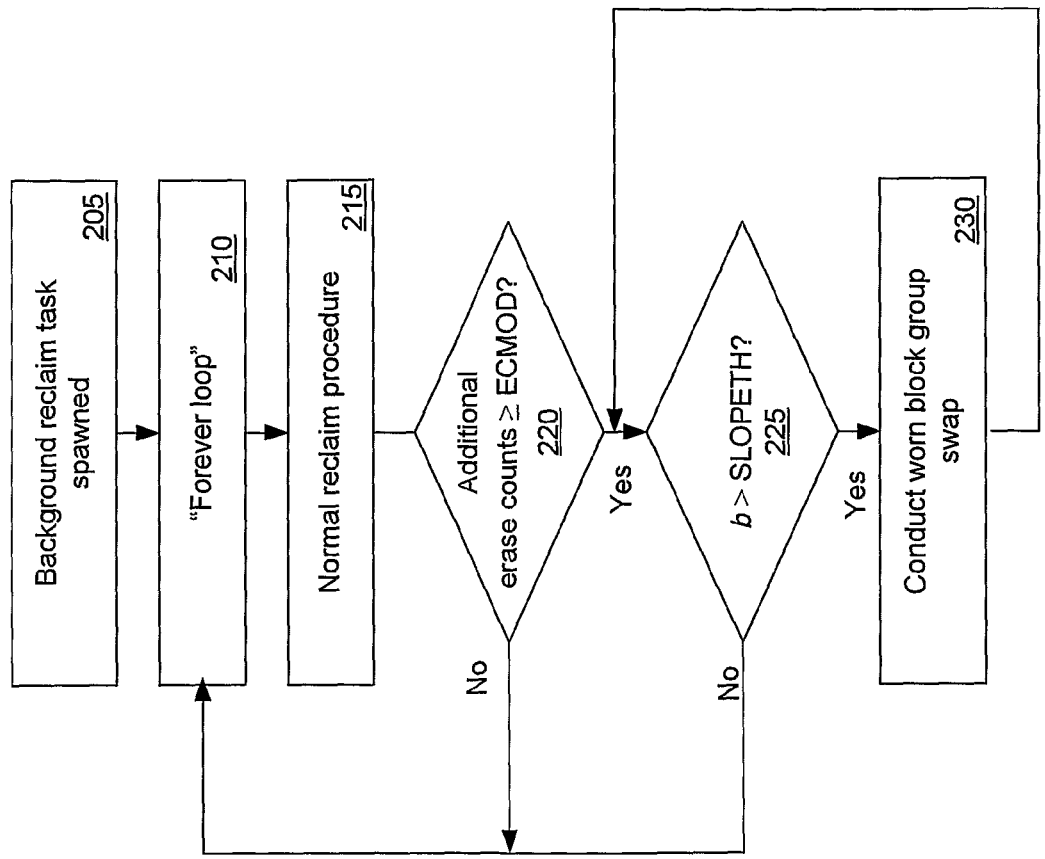
FIG. 2 is a flow chart to illustrate an embodiment of a wear leveling process.

FIG. 2 is a flow chart to illustrate an embodiment of a wear leveling process. In this illustration, a background memory reclaim process is spawned 205, with the process including usual memory reclaiming and memory reclaiming for wear leveling. The reclaim process is in a form of what may be referred to as a "forever loop" 210 that continues repeatedly in operation. In this loop normal memory reclaim processes occur 215.

If ECMOD (error count modulus) additional erase counts have occurred 220, i.e., since the commencement of the background reclaim task or since the last wear leveling operation, then the wear leveling processing is initiated. The slope b of a regression line for physical block erase count (PBEC) and logical block erase count (LBEC) is evaluated in comparison with a threshold SLOPETH 225. If the slope b does not exceed the threshold, the loop continues. If the slope b exceeds the threshold, then a worn block group swap is conducted 230, with the data contained in the most worn group (a group that includes memory blocks with higher values of PBEC and LBEC, as well as spare memory blocks) being exchanged with the data contained in the least worn group (a group that includes memory blocks with lower values of PBEC and LBEC, excluding spare memory blocks). After the swap, the slope b is again compared to threshold SLOPETH 225, with the swapping process then continuing until slope b no longer exceeds the threshold b SLOPETH.

In an embodiment, the process may vary with regard to the threshold used for wear leveling. For example, the initiation of a wear leveling process may occur when the slope b exceeds a first threshold (SLOPETH1), and with the wear leveling process continuing until slope b is below a second threshold (SLOPETH2), where, for example, SLOPETH2 may be less than SLOPETH1.

Figure 3A:
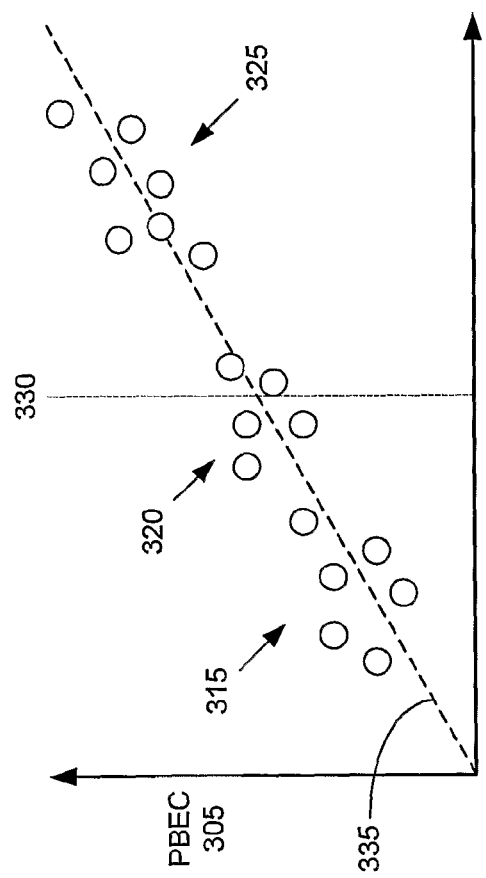
FIG. 3A is an illustration of a regression line generated for a non-volatile memory prior to wear leveling.

FIG. 3A is an illustration of a regression line generated for a non-volatile memory prior to wear leveling. In this illustration, each block of a hypothetical non-volatile memory is presented in terms of physical block erase count (PBEC 305) and logical block erase count (LBEC 310). When a flash memory is new, there initially will be very low or zero physical block erase counts and logical block erase counts. However, as more write cycles occur, the more active memory blocks will develop higher count values for both physical block erase counts and logical block erase counts, such as shown in FIG. 3A.

As shown in this illustration, over time it may be expected that there will be certain memory blocks having low PBEC and LBEC values 315, certain blocks with medium PBEC and LBEC values 320, and certain blocks with high PBEC and LBEC values 325. In an embodiment of the invention, linear regression is utilized to generate a regression line for the memory block values 335. For ease of illustration, a symmetry line 330 is provided. The memory blocks on the right side of the symmetry line 330 are becoming worn in comparison to the memory blocks on the left side of the symmetry line 330, which can result in premature failure of the device if wear leveling is not instituted.

In an embodiment of the invention, a wear leveling evaluation may occur after a certain number of erase events have occurred. In the evaluation, a wear leveling process may be initiated if the slope of the regression line 335 is above a threshold value, resulting in the exchange of worn block groups 350. In the exchange, data contained in the blocks of the most worn group 325 are exchanged for blocks in the least worn group 315. In an embodiment, the swap is accomplished through a series of reclaim operations. After the exchange, a regression line is again generated and the slope is again compared to a threshold value. The process continues until the slope has been sufficiently modified to fall below the threshold.

Figure 3B:
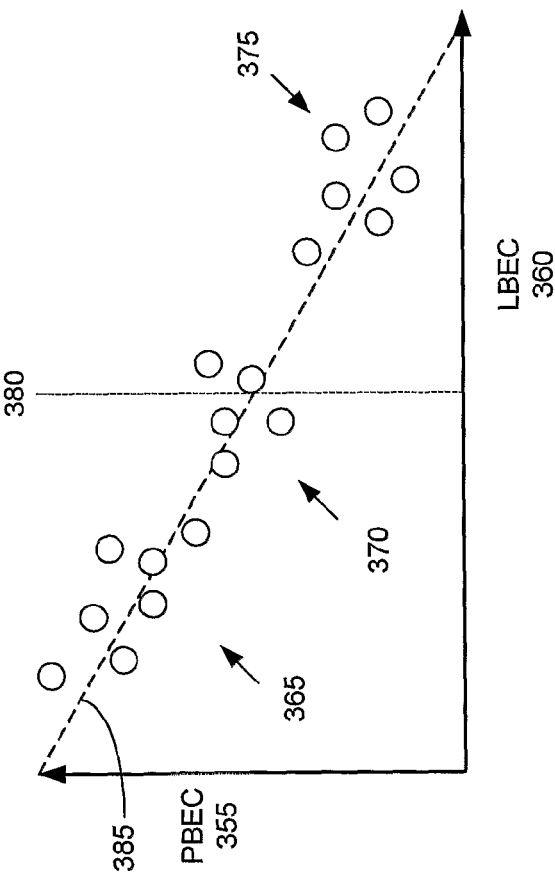
FIG. 3B is an illustration of a regression line generated for a non-volatile memory after an embodiment of wear leveling is implemented.

FIG. 3B is an illustration of a regression line generated for a non-volatile memory after an embodiment of wear leveling is implemented. In this illustration, each block of a hypothetical non-volatile memory is again presented in terms of physical block erase count (PBEC 355) and logical block erase count (LBEC 360). Subsequent to the worn group exchanges, the slope of the resulting regression line has changed 385. After the exchanges, there are memory blocks with high PBEC and low LBEC 365, memory blocks with medium PBEC and LBEC values 370 (which likely have not been involved in any exchanges), and memory blocks with low PBEC and high LBEC values 375. For ease of illustration, a symmetry line 380 is again provided. In essence, the memory blocks on the right side of the symmetry line 380 are now blocks with relatively low wear but now with active data that may result in future wear. The memory blocks on the left side of the symmetry line 380 are now blocks with relatively high wear but now with data that is less active and thus may be expected to result in less future wear.

FIGS. 4 through 7 illustrate an example of memory block reclaim operations in an embodiment of a wear leveling process. The figures illustrate memory blocks of an exemplary non-volatile memory. As illustrated, PBn means the $n^{th}$ physical block and LBn means the $n^{th}$ logical block. As is shown in the illustration, any memory block has a physical block address and either has a logical block address or is designated as a spare. In this illustration, the memory device includes eight memory blocks (PR0 through PB7). In the figures, each memory block is designated by its physical block address 405, it logical block address 410, its logical block erase count 415, and its physical block erase count 420. In an embodiment of the invention, an IWL process is implemented, and data contained in memory blocks of the appropriate groups are swapped via series of reclaim processes. While FIGS. 4 through 7 illustrate a particular process for swapping the data, embodiments of the invention are not limited to any particular process for carrying out the swap process.

In FIG. 4, the blocks of an exemplary non-volatile memory are shown. For ease of illustration, the wear that has occurred generally increases from PB0 through PB7. However, the actual wear may occur in any of the memory blocks there would not necessarily be an order. In a particular implementation, interval and slope threshold values are set, which in this instance may be ECMOD=135 and SLOPETH=0.09. These are particular values for this example, but these values can be modified as required.

In FIG. 4, Sum(LBEC)=135, Sum(PBEC)=135, and b=0.0976515 by calculation trend of the raw data set $(l_1, p_1)$, $(l_2, p_2), \ldots, (l_n, p_n)$. As the erase count has reached ECMOD, there is an evaluation of the slope. In this case the slope is greater than SLOPETH value 0.09, indicating excessive imbalance in wear for the memory. Thus, a wear leveling process is begun.

In an embodiment of the invention, the memory blocks may be separated into groups in various different ways. For the simplified example presented in FIG. 4, is it possible that the low group may include PB0 425 (with LBEC=7 and PBEC=4) and PB1 430 (with LBEC=3 and PBEC=6). It can be seen that these blocks have low wear, and do not appear to contain active data. For the high group, the blocks may include PB6 455 (with LBEC=30 and PBEC=28) and PB7 460 (a spare block with PBEC=30). In this illustration, the high and low groups are composed of adjacent memory blocks, but this is only for simplicity in illustration. In practice, any memory blocks may be included in either the high group or the low group. The remaining blocks (PB2 435, PB3 440, PB4 445, and PB5 450) fall into the middle group and are not involved in the swap. If the swap does not provide a sufficient change in slope, then these remaining blocks may be pulled into the low and high groups for swap operation.

In an embodiment of the invention, the swaps may be implemented through a series of operations using a conventional reclaim process. For example, if there is a swap between PB0 425 and PB7 460 using the process Reclaim (PB0, PB7), this results in copying data from PB0 to PB7, erasing PB0, and setting PB0 it as spare block. In the example of FIG. 4, Reclaim(PB0, PB7) is the first swap made.

FIG. 5 is the resulting memory after Reclaim(PB0, PB7). In this instance, PB0 525 is now the spare block, with PBEC increased from 4 to 5. PB7 560 now is LB6, with LBEC now increasing from 7 to 8. (PBEC of PB7 560 remains at 30 because this is a spare block, which thus has already been erased and does not require erasing prior to writing the data.) At this point Sum(LBEC)=136, Sum(PBEC)=136, and b=−0.11161.

FIG. 6 is the resulting memory after the next following operation, which is Reclaim(PB6, PB0). After the operation, PB6 655 is now the space block, with PBEC increased from 28 to 29. PB0 625 is now LB0, with LBEC increasing from 30 to 31. At this point in the exchange process Sum(LBEC)=137, Sum(PBEC)=137, and b=−0.28086.

Figure 7:
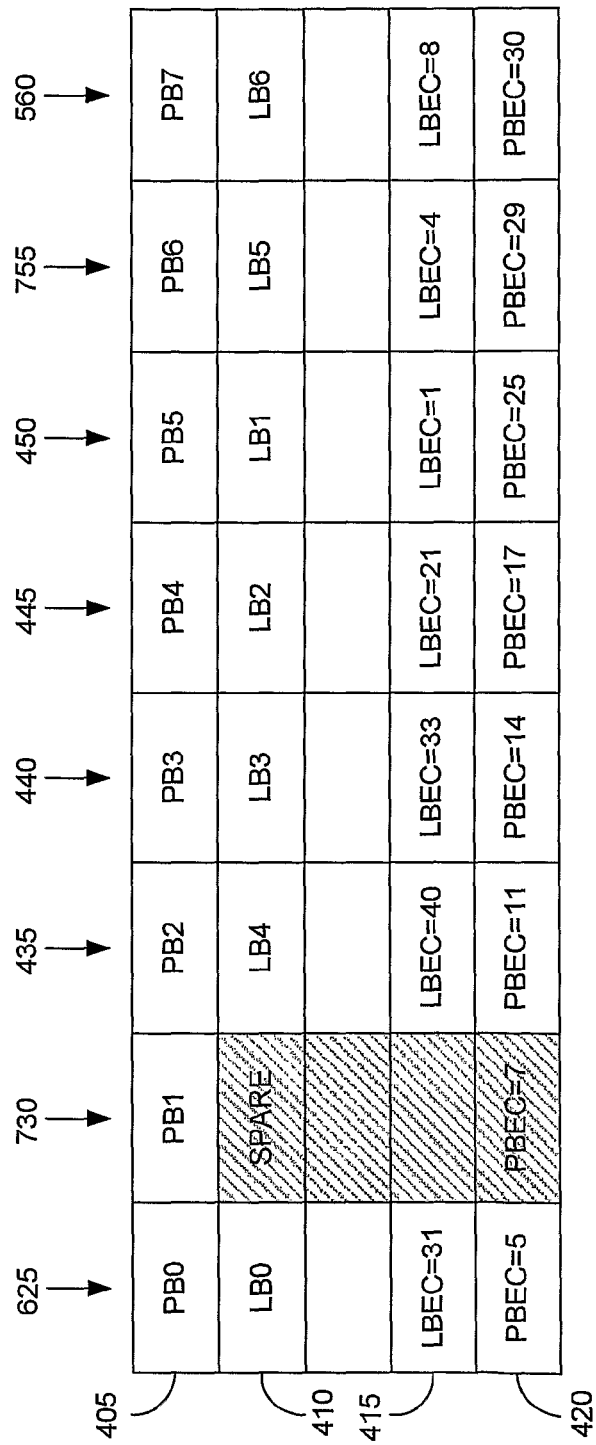

FIG. 7 is the resulting memory after the final in the series of operations, Reclaim(PB6, PB1). At this final stage, PB0 625 has LBEC=31 and PBEC=5, and PB1 730 is the spare block (which thus is a likely next reclaim block) with PBEC=7. Thus, the group of blocks with the lowest amount of wear now has more active data, thus matching low wear with high data activity. Further, PB6 755 has LBEC=4 and PBEC=29, and PB7 560 has LBEC=8 and PBEC=30. The group of blocks with the highest amount of wear now has less active data, matching high wear with low data activity. After the final in the series of reclaim operations Sum(LBEC)=138, Sum(PBEC)=138, and b=−0.54262. Thus, the slope of the PBEC-LBEC regression line as been reduced below the threshold. In embodiment of the invention, the wear leveling operation thus is complete. The system will then wait ECMOD erase cycles before again comparing the slope to the threshold to determine whether another wear leveling cycle is required. If the slope of the PBEC-LBEC regression line had not been reduced below the threshold then the exchange process would continue, providing additional data exchanges to reduce the slope below the required value.

Figure 8:
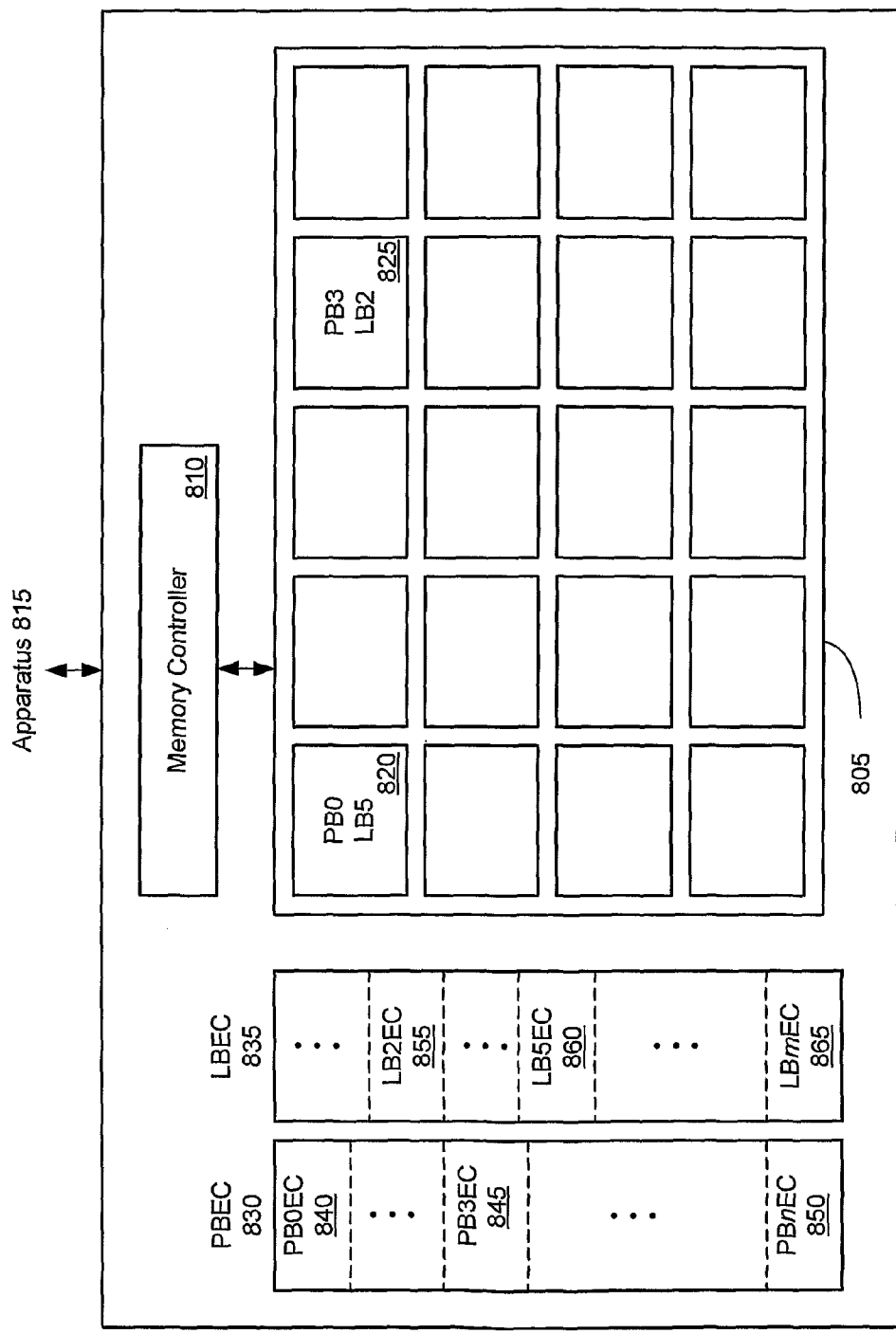
FIG. 8 is an illustration of an embodiment of a non-volatile memory device.

FIG. 8 is an illustration of an embodiment of a non-volatile memory device. In this illustration, a non-volatile memory device 800, such as a flash memory, may be coupled with or as a part of an apparatus 815. The apparatus may be any apparatus that requires electronic memory, including a computer, a PDA (personal digital assistant) or handheld computer, a digital camera, a digital music player, or other unit. The memory device 800 includes a memory array 805 coupled with a memory controller 810, the memory controller 810 controlling the storage of data in the memory array 805. The memory array 805 includes multiple memory blocks of memory cells, including for example a first memory block 820 and a second memory block 825. In this example, the first memory block 820 is physical block PB0 and logical block LB5, and the second memory block 825 is physical block PB3 and logical block LB2. The memory controller 810 may be responsible for the assignment of logical memory locations, such the apparatus 815 addresses memory cells by logical locations and is not aware of the physical locations of the memory cells.

In an embodiment of the invention, the memory controller 810 records a count of each erase-write cycle for the memory array 805, with the count including a count for each physical block and each logical block. In an embodiment, the counts are used to implement wear leveling operations for the memory device. In an embodiment, the memory device 800 may include a registry or registries containing the current write-erase cycle counts. As illustrated the memory device 810 includes a registry of physical block erase counts 830 and a registry of logical block erase counts 835. As shown, the registry of physical block erase counts 830 includes PB0EC (the erase count for PB0) 840 for the first memory block 820 and PB3EC 845 for the second memory block 825, continuing through PBnEC 850 for the nth physical block. The registry of logical block erase counts 835 includes LB2EC (the erase count for LB2) 855 for the first memory block 820 and LB5EC 860 for the second memory block 825, continuing through LBmEC 865 for the mth logical block. The memory array 805 may include one or more spare blocks that are not assigned to a logical memory block, and thus m may be less than n.

In an embodiment of the invention, the memory controller 810 evaluates the current state of wear of the blocks of the memory array 805. In an embodiment, the evaluation occurs after ECMOD number of erase cycles. In an embodiment of the invention, the memory controller 810 calculates a slope of a regression line for the data contained in the registry of physical block erase counts 830 and the registry of logical block erase counts 835. If the slope of the regression line exceeds a threshold (SLOPETH), then the memory controller 810 identifies a high wear group of memory blocks (having high PBEC and LBEC values, including spare blocks) and a low wear group of memory blocks (having low PBEC and LBEC values), and proceeding to exchange data between the groups to transfer active data to low wear memory blocks.

Figure 9:
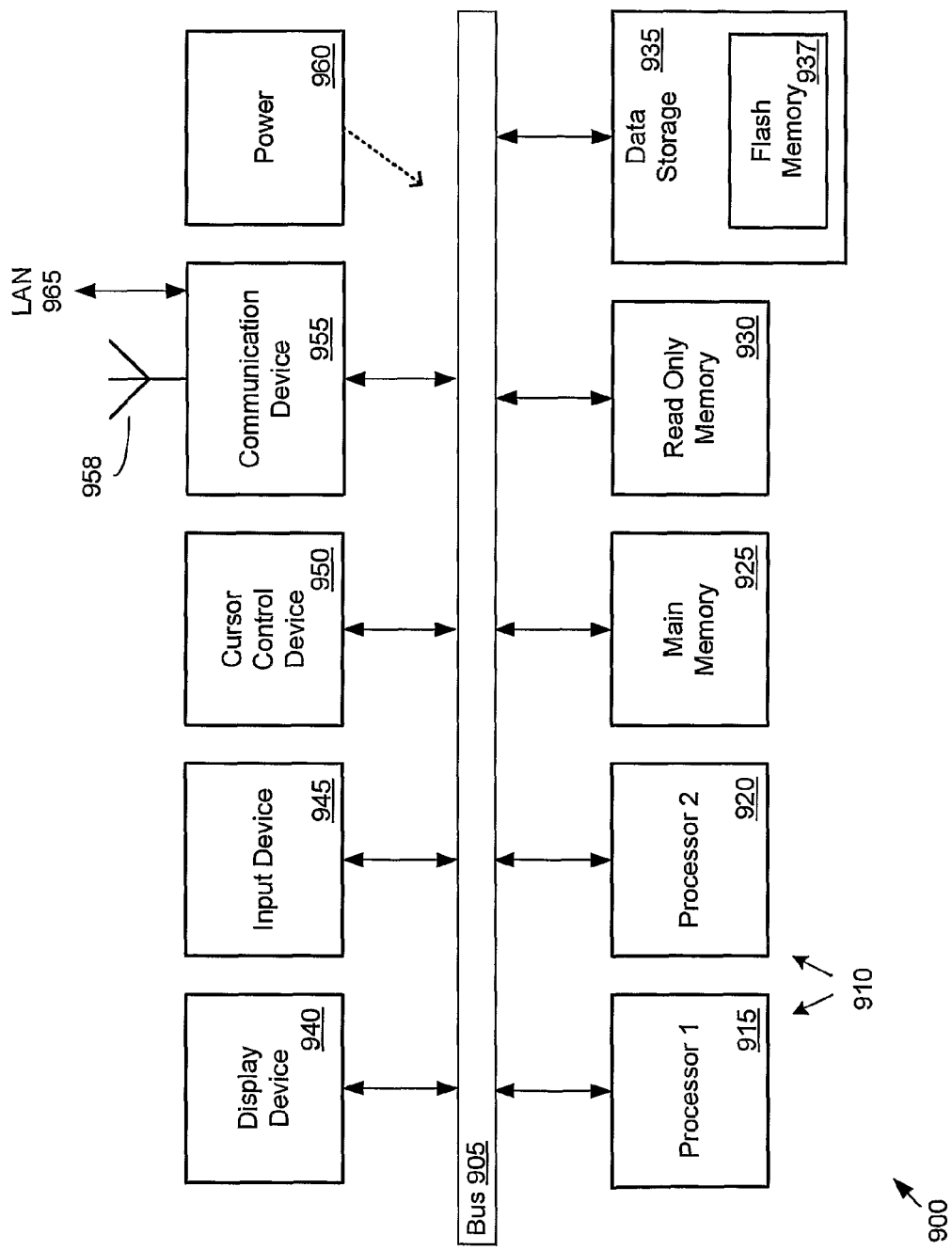
FIG. 9 is an illustration of a computer system utilizing an embodiment of the invention.

FIG. 9 is an illustration of a computer system utilizing an embodiment of the invention. Certain standard and well-known components that are not germane to the present invention are not shown. Under an embodiment of the invention, a computer 900 comprises a bus 905 or other communication means for communicating information, and a processing means such as two or more processors 910 (shown as a first processor 915 and a second processor 920) coupled with the bus 905 for processing information. The processors 910 may comprise one or more physical processors and one or more logical processors. Further, each of the processors 910 may include multiple processor cores. The computer 900 is illustrated with a single bus 905 for simplicity, but the computer may have multiple different buses and the component connections to such buses may vary. The bus 905 shown in FIG. 9 is an abstraction that represents any one or more separate physical buses, point-to-point connections, or both connected by appropriate bridges, adapters, or controllers. The bus 905, therefore, may include, for example, a system bus, a Peripheral Component Interconnect (PCI) bus, a HyperTransport or industry standard architecture (ISA) bus, a small computer system interface (SCSI) bus, a universal serial bus (USB), IIC (I2C) bus, or an Institute of Electrical and Electronics Engineers (IEEE) standard 1394 bus, sometimes referred to as "Firewire". ("Standard for a High Performance Serial Bus" 1394-1995, IEEE, published Aug. 30, 1996, and supplements)

The computer 900 further comprises a random access memory (RAM) or other dynamic storage device as a main memory 925 for storing information and instructions to be executed by the processors 910. Main memory 925 also may be used for storing temporary variables or other intermediate information during execution of instructions by the processors 910. RAM memory includes dynamic random access memory (DRAM), which requires refreshing of memory contents, and static random access memory (SRAM), which does not require refreshing contents, but at increased cost.

DRAM memory may include synchronous dynamic random access memory (SDRAM), which includes a clock signal to control signals, and extended data-out dynamic random access memory (EDO DRAM). The uses of the main memory may include the storage received signals from wireless devices. The computer 900 also may comprise a read only memory (ROM) 930 and/or other static storage device for storing static information and instructions for the processors 910.

Data storage 935 may also be coupled to the bus 905 of the computer 900 for storing information and instructions. The data storage 935 may include a magnetic disk or optical disc and its corresponding drive, flash memory or other nonvolatile memory, or other memory device. Such elements may be combined together or may be separate components, and utilize parts of other elements of the computer 900. In an embodiment of the invention, the data storage 935 may include flash memory 937. In embodiment, the flash memory 937 provides for wear leveling processes to even the wear on memory blocks of the flash memory 937 caused by an imbalance in the erase-write cycles for each memory block.

The computer 900 may also be coupled via the bus 905 to a display device 940, such as a cathode ray tube (CRT) display, a liquid crystal display (LCD), a plasma display, or any other display technology, for displaying information to an end user. In some environments, the display device may be a touch-screen that is also utilized as at least a part of an input device. In some environments, display device 940 may be or may include an audio device, such as a speaker for providing audio information. An input device 945 may be coupled to the bus 905 for communicating information and/or command selections to the processors 910. In various implementations, input device 945 may be a keyboard, a keypad, a touch-screen and stylus, a voice-activated system, or other input device, or combinations of such devices. Another type of user input device that may be included is a cursor control device 950, such as a mouse, a trackball, or cursor direction keys for communicating direction information and command selections to the one or more processors 910 and for controlling cursor movement on the display device 940.

A communication device 955 may also be coupled to the bus 905. Depending upon the particular implementation, the communication device 955 may include a transceiver, a wireless modem, a network interface card, LAN (Local Area Network) on motherboard, or other interface device. The uses of a communication device 955 may include reception of signals from wireless devices. For radio communications, the communication device 955 may include one or more antennas 958. In one embodiment, the communication device 955 may include a firewall to protect the computer 900 from improper access. The computer 900 may be linked to a network, such as LAN (local area network) 965, or to other devices using the communication device 955, which may include links to the Internet, a local area network, or another environment. The computer 900 may also comprise a power device or system 960, which may comprise a power supply, a battery, a solar cell, a fuel cell, or other system or device for providing or generating power. The power provided by the power device or system 960 may be distributed as required to elements of the computer 900.

Those skilled in the art having the benefit of this disclosure will appreciate that many other variations from the foregoing description and drawings may be made within the scope of the present invention. Indeed, the invention is not limited to the details described above. Rather, it is the following claims including any amendments thereto that define the scope of the invention.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form.

The present invention may include various processes. The processes of the present invention may be performed by hardware components or may be embodied in machine-executable instructions, which may be used to cause a general-purpose or special-purpose processor or logic circuits programmed with the instructions to perform the processes. Alternatively, the processes may be performed by a combination of hardware and software.

Portions of the present invention may be provided as a computer program product, which may include a machine-readable medium having stored thereon instructions, which may be used to program a computer (or other electronic devices) to perform a process according to the present invention. The machine-readable medium may include, but is not limited to, floppy diskettes, optical disks, CD-ROMs (compact disk read-only memory), and magneto-optical disks, ROMs (read-only memory), RAMs (random access memory), EPROMs (erasable programmable read-only memory), EEPROMs (electrically-erasable programmable read-only memory), magnet or optical cards, flash memory, or other type of media / machine-readable medium suitable for storing electronic instructions. Moreover, the present invention may also be downloaded as a computer program product, wherein the program may be transferred from a remote computer to a requesting computer by way of data signals embodied in a carrier wave or other propagation medium via a communication link (e.g., a modem or network connection), Many of the methods are described in their most basic form, but processes can be added to or deleted from any of the methods and information can be added or subtracted from any of the described messages without departing from the basic scope of the present invention. It will be apparent to those skilled in the art that further modifications and adaptations can be made. The particular embodiments are not provided to limit the invention but to illustrate it. The scope of the present invention is not to be determined by the specific examples provided above but only by the claims below.

It should also be appreciated that reference throughout this specification to "one embodiment" or "an embodiment" means that a particular feature may be included in the practice of the invention. Similarly, it should be appreciated that in the foregoing description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims are hereby expressly incorporated into this description, with each claim standing on its own as a separate embodiment of this invention.

What is claimed is:

1. A method comprising:
    counting erase cycles for each of a plurality of memory blocks of a non-volatile memory, the counting of erase cycles for each memory block including:
        incrementing a first count of erase cycles for a physical block address of the memory block, and
        if the memory block is not a spare memory block, incrementing a second count of erase cycles for a logical block address of the memory block;
    determining whether the non-volatile memory has uneven wear of memory blocks based at least in part on the counting of the erase cycles of the plurality of memory blocks, wherein wear refers to the usage of the memory blocks of the non-volatile memory; and if the non-volatile memory has uneven wear of memory blocks, then performing swapping of worn block groups;

wherein determining whether the non-volatile memory has uneven wear of memory blocks includes comparing a slope of a regression line for the number of erase cycles for each of the memory blocks by physical block address and by logical block address with a slope threshold.

2. The method of claim 1, wherein performing swapping of worn block groups includes:

identifying a first group of memory blocks of the non-volatile memory having high levels of wear and a second group of memory blocks of the non-volatile memory having low levels of wear, and exchanging data from one or more memory blocks of the first group with data from one or more memory blocks of the second group.

3. The method of claim 2, wherein exchanging data between a first memory block and a second memory block of the plurality of memory blocks includes transferring the logical block address from the first memory block to the second memory block, wherein transferring the first logical block address comprises removing the first logical block address as the logical block address of the first memory block and storing the first logical block address in the second memory block as the logical block address of the second memory block.

4. The method of claim 2, wherein exchanging data from one or more memory blocks of the first group with data from one or more memory blocks of the second group includes a series of memory block reclaim operations.

5. The method of claim 1, wherein the slope of the regression line is compared with the slope threshold after a predetermined number of erase cycles for the non-volatile memory have occurred.

6. The method of claim 1, wherein the non-volatile memory is a flash memory.

7. A non-volatile memory device comprising:

a memory array, the memory array including a plurality of memory blocks, each memory block having a physical block address, and each memory block either having a logical block address or being a spare memory block; and a memory controller coupled with the memory array, the memory controller to control the storage of data in the memory array;

wherein each of the plurality of memory blocks includes one or more fields to record a number of erase operations in the usage of each memory block, the one or more fields of a memory block including a first field for a count of erase cycles for a physical block address of the memory block and, if the memory block is not a spare, a second field for a count of erase cycles for a logical block address of the memory block;

wherein the memory controller is to determine whether the memory array has uneven wear of memory blocks by comparing a slope of a regression line for the number of erase cycles for each of the memory blocks by physical block address and by logical block address with a slope threshold.

8. The device of claim 7, wherein the memory controller compares the slope of the regression line with the slope threshold after a predetermined number of erase cycles has occurred.

9. The device of claim 7, wherein the memory controller is to perform a switch of memory blocks if the slope of the regression line exceeds the slope threshold.

10. The device of claim 9, wherein the switch of memory blocks includes switching data between a first group of the memory blocks having high erase counts with a second group of memory blocks having low erase counts.

11. The device of claim 7, wherein the memory array comprises a flash memory array.

12. A system comprising:

a bus;

a flash memory device coupled with the bus, the non-volatile memory device including a plurality of memory blocks;

a dynamic random access memory coupled with the bus; and a processor coupled with the bus, the processor to transfer data between the dynamic random access memory and the flash memory device;

wherein the system tracks the number of erase cycles for each of the memory blocks by physical block address and by logical block address and determines whether the flash memory device has uneven wear by comparing a slope of a regression line for the number of erase cycles for each of the memory blocks by physical block address and by logical block address with a slope threshold.

13. The system of claim 12, wherein the system is to determine whether the flash memory device has uneven wear each time a predetermined number of erase cycles has occurred.

14. A non-transitory computer-readable storage medium having stored thereon data representing sequences of instructions that, when executed by a processor, cause the processor to perform operations comprising:

counting erase cycles for each of a plurality of memory blocks of a flash memory, the counting of erase cycles for a memory block including:

incrementing a first count of erase cycles for a physical block address of the memory block, and if the memory block is not a spare memory block, incrementing a second count of erase cycles for a logical block address of the memory block;

determining whether the flash memory has uneven wear of memory blocks based at least in part on the counting of the erase cycles of the plurality of memory blocks, wherein wear refers to the usage of the memory blocks of the non-volatile memory; and if the non-volatile memory has uneven wear of memory blocks, then performing swapping of worn block groups;

wherein determining whether the non-volatile memory has uneven wear of memory blocks includes comparing a slope of a regression line for the number of erase cycles for each of the memory blocks by physical block address and by logical block address with a slope threshold.

15. The medium of claim 14, wherein performing swapping of worn block groups includes:

identifying a first group of memory blocks of the flash memory having high levels of wear and a second group of memory blocks of the non-volatile memory having low levels of wear, and exchanging data from one or more memory blocks of the first group with data from one or more memory blocks of the second group.

16. The medium of claim 15, wherein exchanging data from one or more memory blocks of the first group with data from one or more memory blocks of the second group includes a series of memory block reclaim operations.

* * * * *